United States Patent [19]

Yook et al.

[11] Patent Number: 5,445,990
[45] Date of Patent: Aug. 29, 1995

[54] METHOD FOR FORMING A FIELD OXIDE FILM IN A SEMICONDUCTOR DEVICE

[75] Inventors: Hyung S. Yook; Sang H. Park, both of Kyungki; Hyun C. Baek, Seoul; Young C. Lee, Daejeon; Sang I. Kim; Dong W. Baik, both of Seoul, all of Rep. of Korea

[73] Assignee: Hyundai Electronics Industries Co., Ltd., Seoul, Rep. of Korea

[21] Appl. No.: 247,153

[22] Filed: May 19, 1994

[30] Foreign Application Priority Data

May 21, 1993 [KR] Rep. of Korea ............ 93-8717

[51] Int. Cl.⁶ ............................................ H01L 21/76
[52] U.S. Cl. ............................................ 437/69
[58] Field of Search ............ 437/69; 148/DIG. 117, 148/DIG. 85, DIG. 86

[56] References Cited

U.S. PATENT DOCUMENTS 5,137,843  8/1992  Kim et al. ............ 437/70

FOREIGN PATENT DOCUMENTS 63-31124   2/1988  Japan ............ 437/69
63-136548  6/1988  Japan ............ 437/69
3142856    6/1991  Japan ............ 437/69

Primary Examiner—George Fourson
Attorney, Agent, or Firm—Pennie & Edmonds

[57] ABSTRACT

A method for forming a field oxide film in a semiconductor device comprises the steps of sequentially forming a pad oxide film and a first buffer silicon nitride film on a silicon substrate, and then forming a first patterned mask on the first buffer silicon nitride film. Subsequently, the resulting exposed part of the first buffer silicon nitride film is etched to expose a portion of the pad oxide film. The first patterned mask is them removed. A buffer oxide film is formed on the resulting exposed part of the pad oxide film and the etched first buffer silicon nitride film. Then, a second buffer silicon nitride film and a second patterned mask is sequentially formed on the buffer oxide film, followed by etching of the resulting exposed part of the second buffer silicon nitride. The second patterned mask is then removed, followed by a formation of a field oxide film by thermal oxidation on the resulting structure. The second buffer silicon nitride is then removed. A bird's beak removal mask is then formed on the field oxide film, followed by removal of a portion of a bird's beak. The bird's beak removal mask, the first buffer silicon nitride, and the pad oxide are sequentially removed. The present invention can minimize the size of the bird's beak generated when the field oxide film is formed on the semiconductor substrate by using a triple buffer (Nitride/Oxide/Nitride).

2 Claims, 4 Drawing Sheets

METHOD FOR FORMING A FIELD OXIDE FILM IN A SEMICONDUCTOR DEVICE

FIELD OF THE INVENTION

The present invention relates to a method for forming a field oxide film in a semiconductor device, and more particularly, to a method for forming a field oxide film in a semiconductor device which can minimize the size of a bird's beak which is generated when a field oxide film is formed on a semiconductor substrate by using a triple buffer (Nitride/Oxide/Nitride).

INFORMATION DISCLOSURE STATEMENT

In a semiconductor device, the size of a unit cell therein is a major factor in determining the die size of the device. Therefore, as semiconductor device integration has increased, techniques for reducing unit cell size in the semiconductor device, which is an important element in miniaturization, have been actively desired. However, conventional techniques for reducing unit cell size have their limits. In particular, when a field oxide film for separating unit cells is grown, so-called bird's beak portions are formed causing isolation regions to extend into the active region, thereby expanding the dimensions of the isolation region.

FIGS. 1A to FIG. 1E illustrate the sequential fabrication process forming a field oxide film in a semiconductor device by using the conventional method.

FIG. 1A illustrates the formation of a pad oxide film 2 on a silicon substrate 1, and FIG. 1B illustrates the formation of a silicon nitride film 3 on the pad oxide film 2.

FIG. 1C illustrates the formation of a patterned mask 4 on the silicon nitride film 3 to define an isolation region. FIG. 1D illustrates the etching of an exposed part of the silicon nitride film 3 by using the patterned mask 4, and then removing the patterned mask 4.

FIG. 1E illustrates the formation of a field oxide film 9 by a field oxidation process.

However, in the conventional isolation method, when the field oxide film is grown, bird's beak portions, A and B in FIG. 1E, are formed causing the isolation regions to extend into the active region, thereby expanding the dimensions of the isolation region. Therefore, expansion is pointedly a problem of highly integrated devices.

SUMMARY OF THE INVENTION

Accordingly, in order to solve the above-mentioned problem present in conventional reduction techniques, a purpose of the present invention is to provide a method for forming a field oxide film in a semiconductor device which can minimize the size of a bird's beak by means of using a triple buffer.

To achieve the above purpose, the method of the present invention comprises the steps of:

Sequentially forming a pad oxide film, and a first buffer silicon nitride film on a silicon substrate, and then forming a first patterned mask on the first buffer silicon nitride film;

Etching the resulting exposed part of the first buffer silicon nitride film to expose a portion of the pad oxide film, and then removing the first separate mask;

Forming a buffer oxide film on the resulting exposed part of the pad oxide film and the etched first buffer silicon nitride film;

Sequentially forming a second buffer silicon nitride film, and a second patterned mask on the buffer oxide film, and then etching the resulting exposed part of the second buffer silicon nitride;

Removing the second patterned mask, and then forming a field oxide film by thermal oxidation of the resulting structure, and then removing the second buffer silicon nitride;

Forming a bird's beak removal mask on the field oxide film, and then removing a portion of a bird's beak; and Sequentially removing the bird's beak removal mask, the first buffer silicon nitride, and the pad oxide.

BRIEF DESCRIPTION OF THE DRAWINGS

The above described purpose and other advantages of the present invention will become ore apparent by describing the preferred embodiment of the present invention with reference to the attached drawings, i which.

DETAILED DESCRIPTION OF THE INVENTION

FIGS. 2A to 2M illustrate the fabrication process sequence of a field oxide film in a semiconductor device according to the present invention.

Figure 1A:
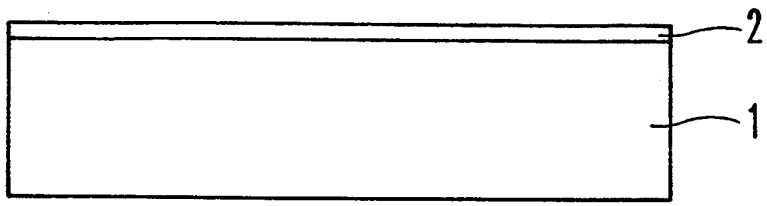
FIGS. 1A to 1E illustrate the fabrication process sequence of a field oxide film in a semiconductor device by using the conventional method.
Figure 1B:
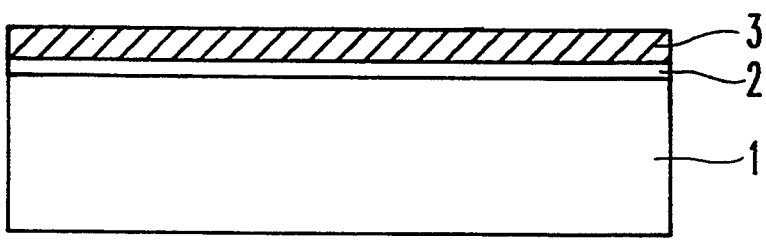
Figure 1C:
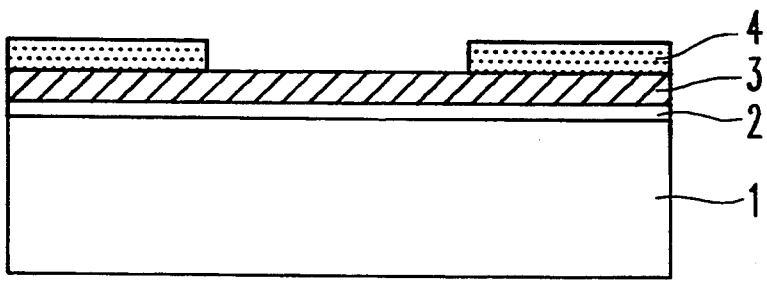
Figure 1D:
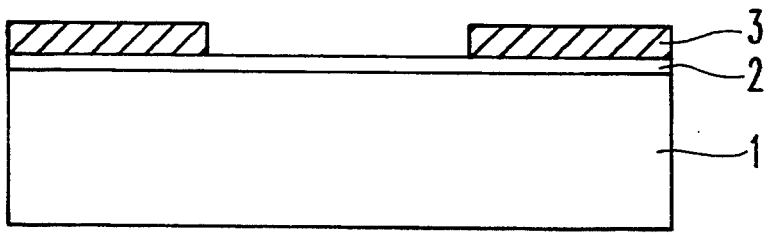
Figure 1E:
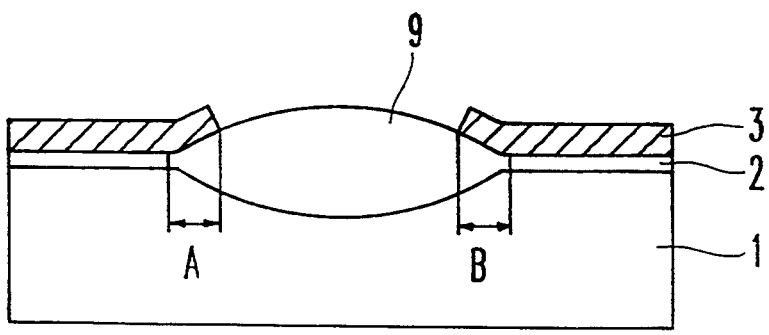
Figure 2A:
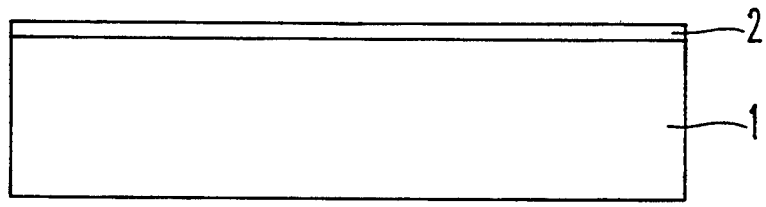
FIGS. 2A to 2M illustrate the fabrication process sequence of a field oxide film in a semiconductor device according to the present invention.
Figure 2B:
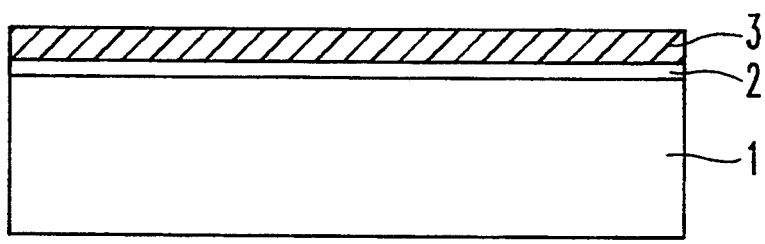

FIG. 2A illustrates the formation of a pad oxide film 2 on a silicon substrate 1, and FIG. 2B illustrates the formation of a first buffer silicon nitride film 3 on the pad oxide film 2.

Figure 2C:
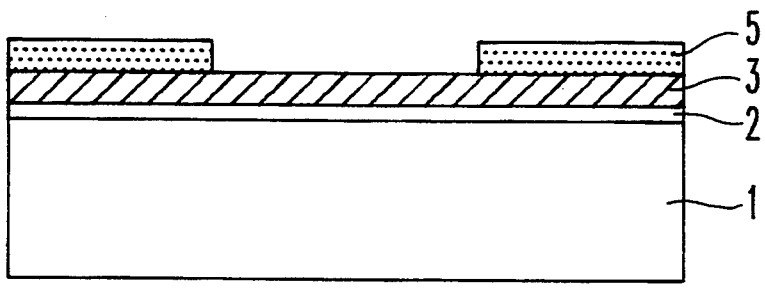
Figure 2D:
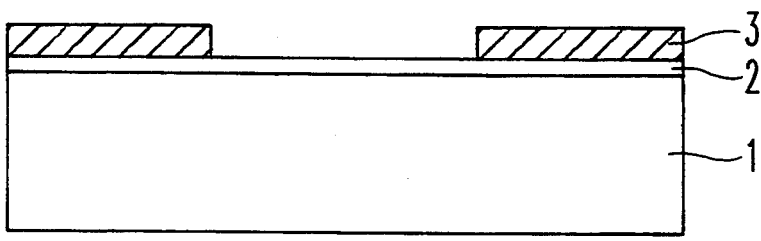

FIG. 2C illustrates the formation of a first patterned mask 5 which is formed by the lithography process using a first photo mask on the first buffer silicon nitride film 3, to define an isolation region, FIG. 2D illustrates etching an exposed part of the first buffer silicon nitride film 3 by using the first patterned mask 5, and then removing the first separate mask 5.

Figure 2E:
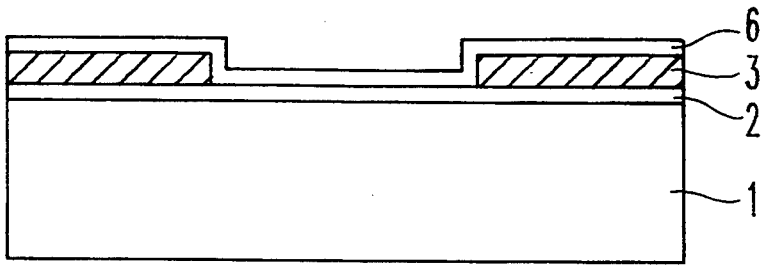
Figure 2F:
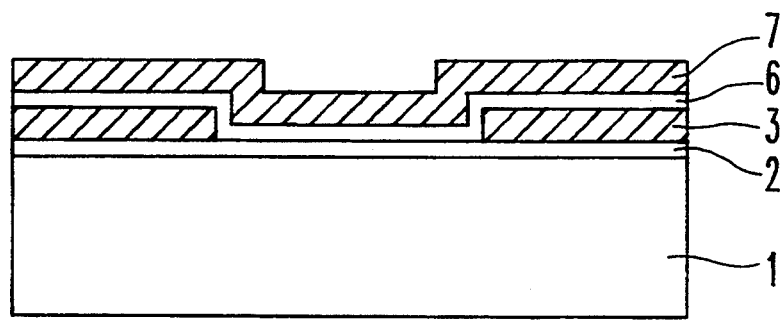

FIG. 2E illustrates the formation of a buffer oxide film 6 on an exposed part of the pad oxide film 2 and the etched first buffer silicon nitride film 3. FIG. 2F illustrates the formation of a second buffer silicon nitride film 7 on the buffer oxide film 6.

Figure 2G:
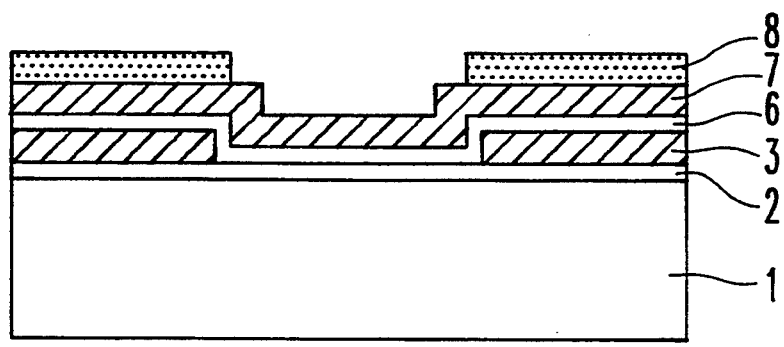
Figure 2H:
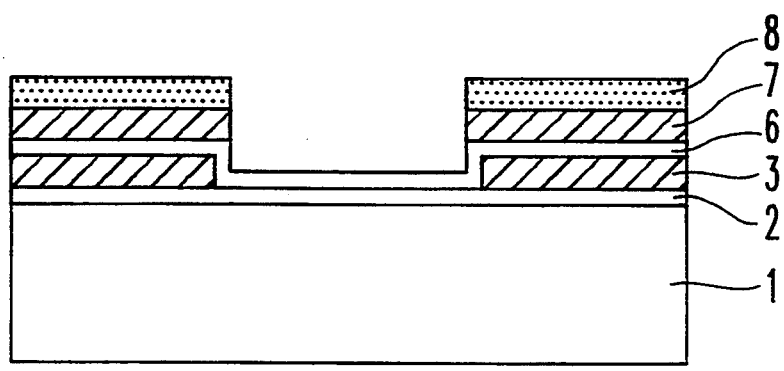

FIG. 2G illustrates the formation of a second patterned mask 8 on the second buffer silicon nitride film 7, FIG. 2H illustrates etching an exposed part of the second buffer silicon nitride 7 by using the second patterned mask 8.

Figure 2I:
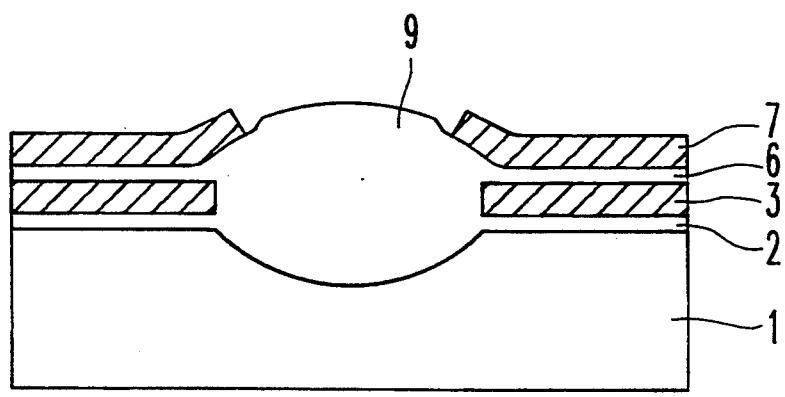
Figure 2J:
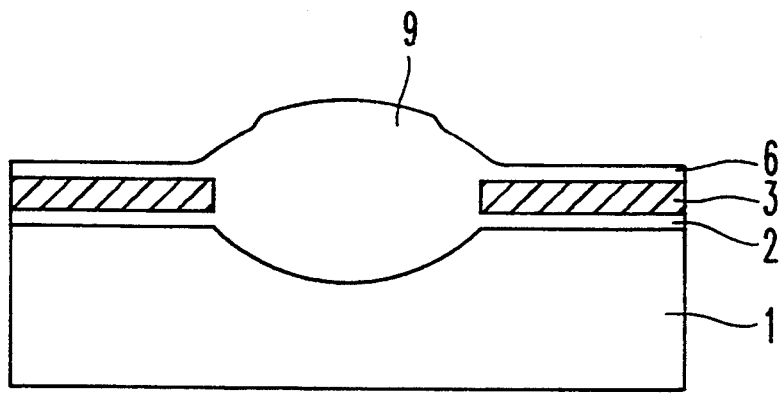
Figure 2K:
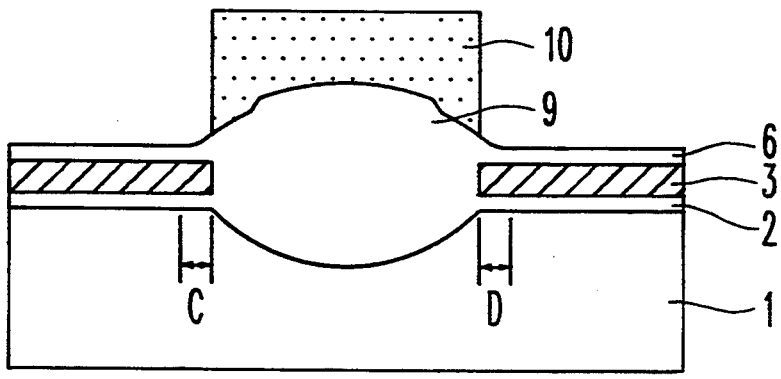

FIG. 2I illustrates the removal of the second patterned mask 8, and then the formation of a field oxide film 9 by means of thermal oxidation. FIG. 2J illustrates the removal of the second buffer silicon nitride 7.

Figure 2L:
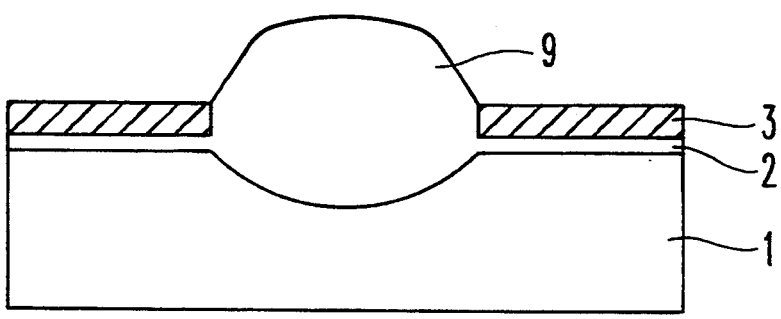
Figure 2M:
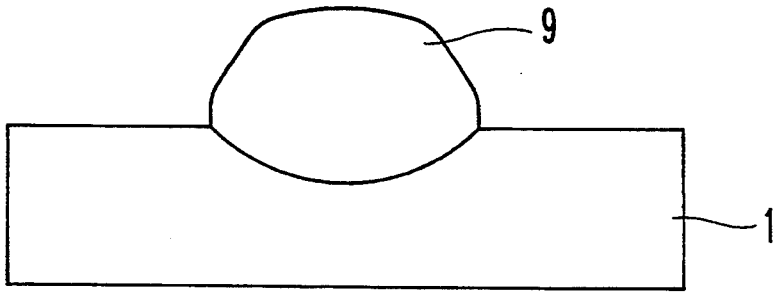

FIG. 2lK illustrates the formation of a bird's beak removal mask 10 which is formed by a lithography process using a second photo mask on the field oxide film 9, whereupon portions C and D of the edges of the field oxide film 9 form a bird's beak.

FIG. 2L illustrates the removal of the buffer oxide film including the bird's beak C and D, and the subsequent removal at the bird's beak removal mask 10. FIG.

2M illustrates etching the first buffer silicon nitride film 3 and the pad oxide film 2.

In the above-described fabrication process, the first patterned mask 5 is used in order to define an isolation region. The size of the second patterned mask 8 is the same or similar to that of the first patterned mask 5. The bird's beak removal mask 10 is formed inversely to the pattern formed by the first patterned mask 5.

As described above, according to the present invention, the bird's beak effect can be minimized, thereby increasing the size of the memory cell active region on the same size. Therefore, the size of the die can be reduced, the net die can be increased and the design margin can be increased, thereby increasing productivity.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for forming a field oxide film in a semiconductor device comprising the steps of:

sequentially forming a pad oxide film and a first buffer silicon nitride film on a silicon substrate, and then forming a first patterned mask on said first buffer silicon nitride film;

etching the resulting exposed part of said first buffer silicon nitride film to expose a portion of the pad oxide film, and then removing said first patterned mask;

forming a buffer oxide film on the resulting exposed part of said pad oxide film and said etched first buffer silicon nitride film;

sequentially forming a second buffer silicon nitride film, and a second patterned mask on said buffer oxide film, and then etching the resulting exposed part of said second buffer silicon nitride film;

removing said second patterned mask, and then forming a field oxide film by thermal oxidation of the resulting structure, and then removing said second buffer silicon nitride film;

forming a bird's beak removal mask on said field oxide film, and then removing a portion of a bird's beak; and sequentially removing said bird's beak removal mask, said first buffer silicon nitride film, and said pad oxide film.

2. A method for forming a field oxide film in a semiconductor device as claimed in claim 1, wherein the size of said second patterned mask is the same as that of said first patterned mask.

* * * * *